United States Patent
Yasui (10) Patent No.: US 7,520,596 B2
(45) Date of Patent: Apr. 21, 2009

(54) METHOD FOR PRODUCING PIEZOELECTRIC ACTUATOR, METHOD FOR PRODUCING INK-JET HEAD, AND PIEZOELECTRIC ACTUATOR

(75) Inventor: Motohiro Yasui, Nagoya (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 456 days.

(21) Appl. No.: 11/232,426

(22) Filed: Sep. 22, 2005

(65) Prior Publication Data

US 2006/0082619 A1 Apr. 20, 2006

(30) Foreign Application Priority Data

Sep. 22, 2004 (JP) ............... 2004-275937

(51) Int. Cl.
*B41J 2/045* (2006.01)
*B05D 5/12* (2006.01)
(52) U.S. Cl. ......................... 347/71; 427/100
(58) Field of Classification Search ............. 347/71; 29/25.35, 890.1; 427/100
See application file for complete search history.

(56) References Cited

U.S. PATENT DOCUMENTS

2002/0053859 A1* 5/2002 Fukui ................ 310/358

2002/0076875 A1 6/2002 Wasa et al.

FOREIGN PATENT DOCUMENTS

| JP | 11298062 | 10/1999 |
| JP | 11314365 | 11/1999 |
| JP | 2001152360 | 6/2001 |
| JP | 2002009358 | 1/2002 |

* cited by examiner

*Primary Examiner*—Luu Matthew
*Assistant Examiner*—Lisa M Solomon
(74) *Attorney, Agent, or Firm*—Banner & Witcoff, Ltd.

(57) ABSTRACT

In a method for manufacturing a piezoelectric actuator, the piezoelectric layer is formed by using material particles M having a composition which differs from an optimum composition by a diffusion amount of Ti. The piezoelectric layer has a two-layer structure including a first piezoelectric layer formed on a vibration plate and a second piezoelectric layer laminated on the first piezoelectric layer. Only the first piezoelectric layer has a composition different from the optimum composition, and the second piezoelectric layer laminated thereupon has the optimum composition. When the piezoelectric layer of such a two-layer structure is subjected to the annealing treatment, the composition of the first piezoelectric layer is corrected and becomes the optimum composition by the diffusion of a diffusion element. On the other hand, because the diffusion does not advance to the second piezoelectric layer which is on the farther side from the vibration plate, the optimum composition of the second piezoelectric layer is maintained.

14 Claims, 5 Drawing Sheets

SEM IMAGE

Fig. 5

AES ANALYSIS

Fig. 6

METHOD FOR PRODUCING PIEZOELECTRIC ACTUATOR, METHOD FOR PRODUCING INK-JET HEAD, AND PIEZOELECTRIC ACTUATOR

BACKGROUND OF THE INVENTION

1. Field of the Invention

The present invention relates to a method for manufacturing a piezoelectric actuator and an ink-jet head and also to a piezoelectric actuator.

2. Description of the Related Art

An example of a piezoelectric actuator for an ink-jet head is disclosed in Japanese Patent Application Laid-open No. 11-314365. This piezoelectric actuator has a substrate (elastic film) provided so as to close the openings in pressure chambers communicated with nozzle openings in a channel forming body of an ink-jet head and has a structure in which lower electrode, a piezoelectric layer, and upper electrodes are laminated in this order on the substrate. When an electric field is applied between the lower electrode and upper electrode, the substrate bends by the deformation of the piezoelectric layer, a pressure is applied to the ink present inside the pressure chambers, and the ink is discharged from the nozzle openings.

A method called an aerosol deposition method (AD method), such as described, for example, in Japanese Patent Application Laid-open No. 2001-152360 has been suggested as a method for the manufacture of the above piezoelectric actuators. In this method, a medium (aerosol) in which fine particles of a piezoelectric material such as lead zirconium titanate (PZT) are dispersed in a gas is ejected toward a substrate surface and a piezoelectric layer (piezoelectric layer) is formed by collisions of the fine particles with the substrate and deposition thereon.

The piezoelectric actuator manufactured by using the above-mentioned AD method has to be subjected to annealing in order to obtain a piezoelectric characteristic necessary to bend the substrate sufficiently. However, when the inventor actually formed a piezoelectric layer on the substrate by the AD method and then conducted annealing, the piezoelectric characteristic degraded.

SUMMARY OF THE INVENTION

The present invention has been made in view of the above-mentioned situations. An object of the present invention is to provide a method for manufacturing a piezoelectric actuator and an ink-jet head which is capable of avoiding the degradation of the piezoelectric characteristic by annealing.

According to a first aspect of the present invention, there is provided a method for manufacturing a piezoelectric actuator provided with a substrate and a piezoelectric layer having the predetermined composition and formed on the substrate, the method including the steps of:

forming the piezoelectric layer by blowing an aerosol containing particles of a piezoelectric material on a surface of the substrate to adhere the particles to the substrate; and annealing the piezoelectric layer, wherein a diffusion element which diffuses between the substrate and the piezoelectric layer in the step of annealing is contained in each of the particles, and a composition ratio of the diffusion element in each of the particles is different from a composition ratio of the diffusion element in the predetermined composition.

The inventor has conducted a comprehensive study with the object of providing the method for manufacturing the piezoelectric actuator and the ink-jet head in which the degradation of the piezoelectric characteristic by annealing can be avoided, and the inventor found the following.

It was found that when annealing is conducted at a high temperature (for example, annealing at a high temperature more than 600° C.), in order to obtain a piezoelectric actuator having a high piezoelectric characteristic, elements contained in the substrate diffuse into the piezoelectric layer or, conversely, elements contained in the piezoelectric layer diffuse into the substrate, thereby degrading the piezoelectric characteristic of the piezoelectric actuator. Examples illustrating how the elements diffuse between the substrate and the piezoelectric layer are shown in FIGS. 4 to 6.

Figure 4:
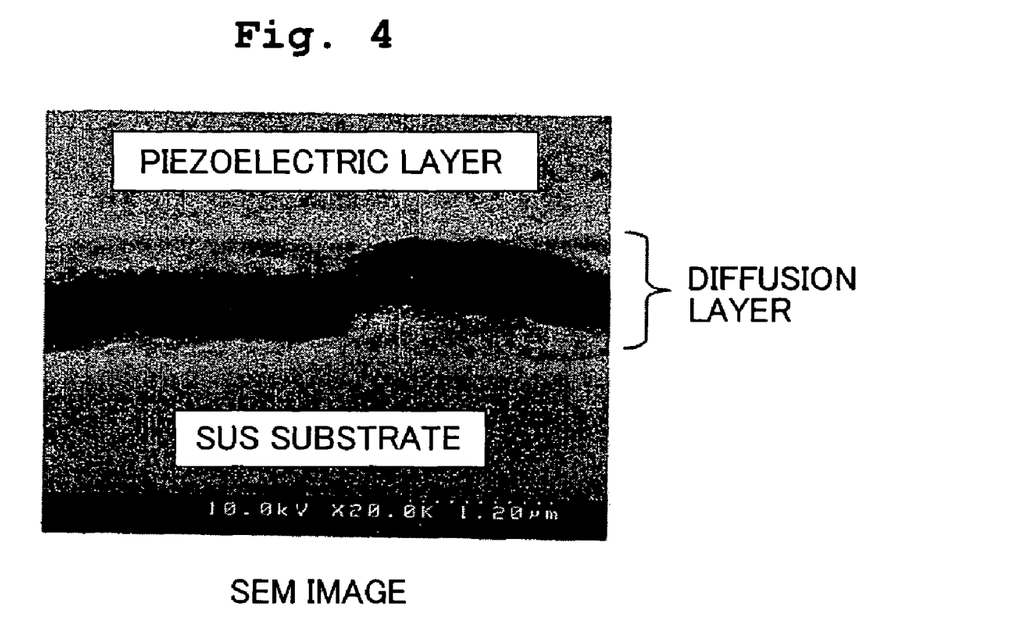
FIG. 4 is a SEM image illustrating the formation of the diffusion layer on the interface between the substrate and the piezoelectric layer by annealing.
Figure 5:
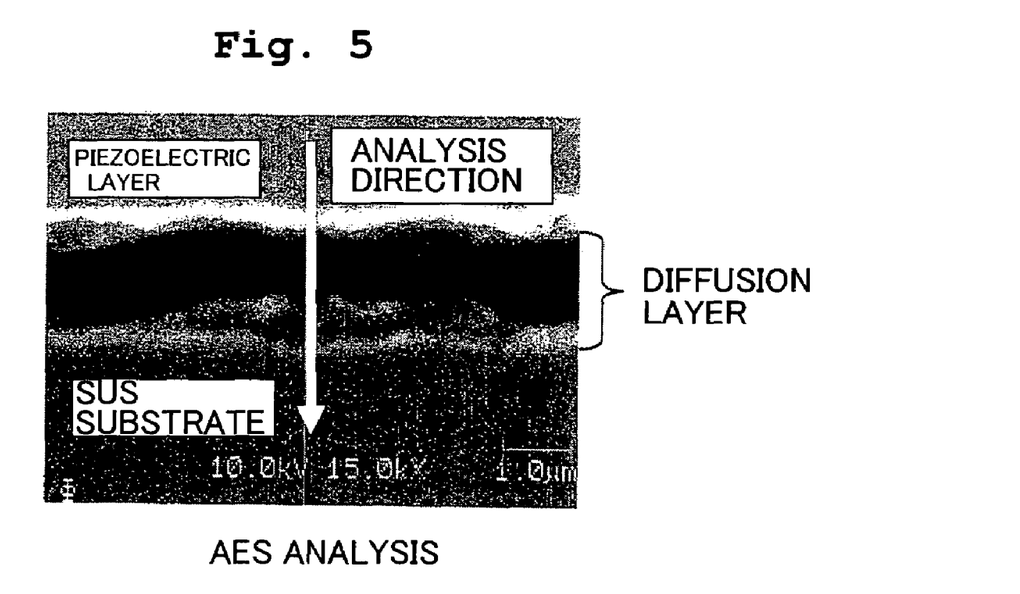
FIG. 5 shows an AES analysis result illustrating the formation of the diffusion layer on the interface between the substrate and the piezoelectric layer by annealing.
Figure 6:
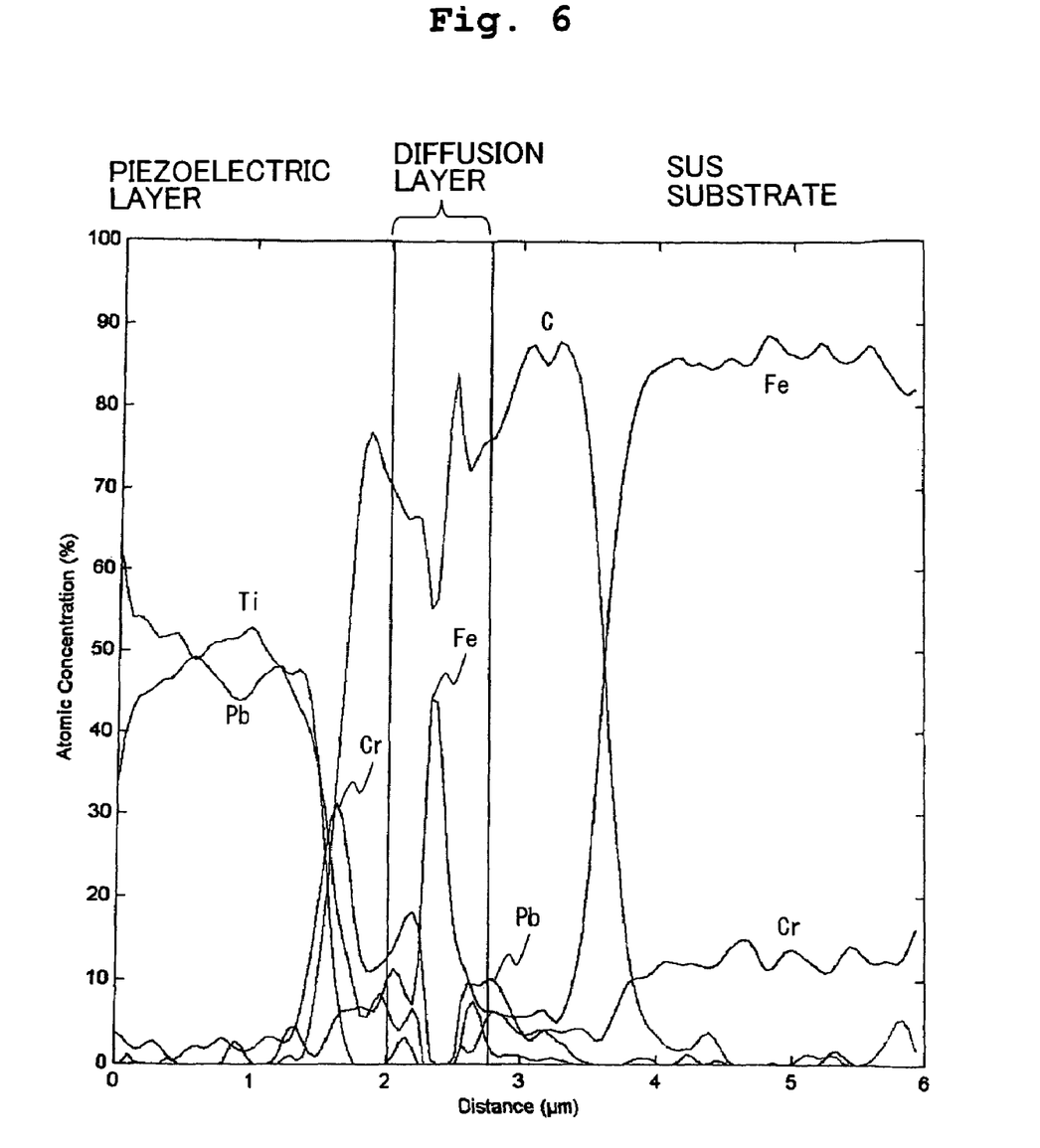
FIG. 6 shows the distribution of atomic concentration of the element in the arrow direction in FIG. 5.

The evaluation results in FIGS. 4 to 6 show a cross section in the vicinity of the interface between the substrate and the piezoelectric layer observed in the case where annealing was conducted for an annealing time of 5 min (minutes) at an annealing temperature of 800° C. after forming a piezoelectric layer composed of PZT on a SUS substrate. In the examples shown in FIGS. 4 to 6, the thickness of the piezoelectric layer was 13 μm. FIG. 4 shows a SEM image, FIG. 5 shows an AES analysis result, and FIG. 6 shows a distribution of atomic concentration. As shown in FIG. 4 and FIG. 5, in an interface of the piezoelectric layer on a side of the substrate, a diffusion layer (the region with dark color in FIGS. 4 and 5) was formed by diffusion of elements contained in the substrate. The results shown in FIGS. 4 and 5 show that the thickness of the diffusion layer is about 0.9 μm.

In addition, FIG. 6 shows the distribution of atomic concentration of the element in a direction of the arrow (direction from the piezoelectric layer toward the substrate) in FIG. 5. As shown in FIG. 6, there is a peak of atomic concentration of Fe contained in the substrate. Furthermore, a peak of atomic concentration of Cr contained in the substrate is present in the piezoelectric layer across the diffusion layer. Namely, the results in FIG. 6 demonstrate that Fe and Cr contained in the substrate diffuse into the piezoelectric layer by the annealing treatment. Furthermore, in the example shown in FIG. 6, the peak of Pb contained in the piezoelectric layer is present in the vicinity of a substrate surface on the side of the diffusion layer, thereby indicating that Pb contained in the piezoelectric layer diffuses into the substrate by the annealing treatment. Thus, FIG. 6 shows that the annealing treatment causes the diffusion of the elements contained in the substrate into the piezoelectric layer and also causes the diffusion of the elements contained in the piezoelectric layer into the substrate, and that the respective constituent elements mutually diffuse to form the diffusion layer in the vicinity of the interface between the substrate and the piezoelectric layer.

The reason for the above-mentioned significant degradation of piezoelectric characteristic by the formation of the diffusion layer in vicinity of the interface between the substrate and piezoelectric layer is described below. For example, when lead zirconium titanate (PZT) is used as a material for the piezoelectric layer, the optimum composition ratio thereof is known to be in vicinity of the ratio Zr:Ti=53:47. This is apparently because a morphotropic phase boundary (MPB) is present in the vicinity of the optimum value. Thus, in the vicinity of the MPB, when the Ti concentration increases, the crystal system makes a transition from a rhombohedral system to a tetragonal system, thereby changing the direction of spontaneous polarization. As a result, the crystal structure becomes unstable and polarization rotation increases.

However, when the composition of the piezoelectric layer is in vicinity of the MPB, the piezoelectric characteristic changes significantly even with small change in the composition ratio. For this reason, even when a piezoelectric layer is formed on the substrate by using a piezoelectric material having prepared the optimum composition ratio, the composition of the piezoelectric layer changes by the occurrence of the mutual diffusion of constituting elements between the piezoelectric layer and the substrate by the annealing treatment, as shown in FIGS. 4 to 6. As a result, the piezoelectric characteristic of the piezoelectric layer might decrease significantly.

Providing a diffusion-preventing layer between the substrate and the piezoelectric layer can be considered as a method for preventing the above-described diffusion phenomenon. However, providing a diffusion-preventing layer increases cost. Furthermore, even when the diffusion-preventing layer is provided between the substrate and the piezoelectric layer, elements contained in the diffusion-preventing layer might diffuse into the piezoelectric layer in some cases by the annealing treatment conducted at a high temperature, and therefore this layer can be hardly considered as sufficient means for preventing the diffusion phenomenon.

In the present invention, in order to resolve the above problem, the composition ratio in the formation of the piezoelectric layer is previously adjusted so that, when the annealing treatment for the piezoelectric layer is terminated rather than when the piezoelectric layer is formed, the composition ratio of elements constituting the piezoelectric layer becomes the optimum value (predetermined composition). Thus, taking into account that the constituent elements of the substrate diffuse into the piezoelectric layer, or the constituent elements of the piezoelectric layer diffuse into the substrate, as described above, in the step of forming the piezoelectric layer, the piezoelectric layer is formed to have a ratio composition different from the optimum composition by the diffusion amount of the diffusion element. When the annealing treatment is conducted at the high temperature after the piezoelectric layer having the above composition has been formed, the optimum composition of the piezoelectric layer is obtained by the diffusion phenomenon of the elements through the interface between the substrate and the piezoelectric layer and thus, a good piezoelectric characteristic can be obtained.

In the method for manufacturing the piezoelectric actuator in accordance with the present invention, the composition ratio of the diffusion element present in each of the particles may be less than the composition ratio of the diffusion element in the predetermined composition. However, the present invention is not limited to this. The composition ratio of the diffusion element in each of the particles may be higher than the composition ratio of the diffusion element in the predetermined composition.

In the method for manufacturing the piezoelectric actuator in accordance with the present invention, the substrate may be a metallic substrate. In particular, the substrate may contain at least one element selected from a group consisting of Cr, Fe, Ti, and Si. In the present invention, the material of the substrate is not limited to the material containing the above elements as long as a material is generally used for the piezoelectric actuator. For example, stainless steel ( SUS430, SUS304, SUS430LX, SUS436L, SUS321 or the like), 42A alloy, alumina, zirconia, titanium or the like may be used. The substrate may include a substrate provided with an intermediate layer such as a lower electrode layer on the surface of the substrate. In this case, the diffusion occurs between the intermediate layer and the piezoelectric layer.

In the method for manufacturing a piezoelectric actuator in accordance with the present invention, any material having the MPB structure may be used as the material for forming the piezoelectric layer. For example, PZT (lead zirconium titanate), PMN (lead magnesium niobate), PLZT (lanthanum-added lead zirconium titanate), PMN-PT (Pb $(Mg_{1/3}Nb_{2/3})O_3$—$PbTiO_3$), PNN-PT (Pb$(Ni_{1/3}Nb_{2/3})O_3$—$PbTiO_3$), PMN-PZT, PNN-PZT or the like may be used.

Furthermore, in the method for manufacturing a piezoelectric actuator in accordance with the present invention, when the piezoelectric layer having a large thickness to some extent is formed, a first piezoelectric layer may be formed by using particles (particles of the first piezoelectric material) having a composition different from the optimum composition (predetermined composition) and then a second piezoelectric layer may be formed by using particles (particles of the second piezoelectric material) having the optimum composition (predetermined composition). Although the thickness of the first piezoelectric layer differs depending on the diffusion ability of the element and cannot be categorically determined, it is preferably not less than 0.2 µm to not more than 1 µm. Furthermore, in this case, the heating temperature in the step of the annealing treatment may be not less than 600° C. to not more than 800° C., and the heating time may be not less than 30 min to not more than 180 min so that the composition of the first piezoelectric layer is optimized by the diffusion phenomenon between the substrate and the first piezoelectric layer.

According to a second aspect of the present invention, there is provided a method for manufacturing an ink-jet head, the ink-jet head including an ink channel forming body having a plurality of pressure chambers each of which is provided with an opening in one surface side of the ink channel forming body and that communicates with an ink discharge nozzle which discharges ink, and a piezoelectric actuator having a vibration plate provided in the one surface side of the ink channel forming body to close the opening and a piezoelectric layer formed on the vibration plate, the method including the steps of:

forming the piezoelectric layer by blowing an aerosol including particles of a piezoelectric material on the surface of the substrate to adhere the particles to the substrate; and annealing the piezoelectric layer, wherein a diffusion element which diffuses between the substrate and the piezoelectric layer in the step of annealing is contained in each of the particles, and a composition ratio of the diffusion element in each of the particles is different from a composition ratio of the diffusion element in a predetermined composition.

The method for manufacturing an ink-jet head in accordance with the present invention may further include, prior to the step of forming the piezoelectric layer, a step of forming the ink channel forming body and a step of joining the vibration plate to the ink jet forming body.

According to a third aspect of the present invention, there is provided a piezoelectric actuator including:

a substrate;

a first piezoelectric layer formed on the substrate; and a second piezoelectric layer formed on the first piezoelectric layer, wherein a composition of the first piezoelectric layer is different from that of the second piezoelectric layer.

In the present invention, considering the diffusion phenomenon of the element from the substrate to the piezoelectric layer or from the piezoelectric layer to the substrate occurring when the piezoelectric actuator is annealed, the piezoelectric layer is formed by using particles of a piezoelectric material with a composition increased or decreased with respect to the predetermined composition based on the diffusion amount of the element. Thus, in the step of forming the piezoelectric layer, the piezoelectric layer is formed to have a composition different from the predetermined composition by the diffusion amount of the diffusion element. For this reason, when annealing is conducted after the piezoelectric layer has been formed, the composition of the piezoelectric layer is corrected to become the predetermined composition (optimum composition) by the diffusion phenomenon between the piezoelectric layer and the substrate. As a result, the good piezoelectric characteristic can be obtained.

Furthermore, in the case that the first piezoelectric layer is formed on the substrate by using particles of a piezoelectric material having a composition different from the predetermined composition and then the second piezoelectric layer is formed thereupon by using particles of a piezoelectric material having the predetermined composition in order to manufacture a piezoelectric actuator having a piezoelectric layer having a large thickness to some extent, when annealing is conducted, then the composition of the first piezoelectric layer is corrected to become the predetermined composition by the diffusion phenomenon between the first piezoelectric layer and the substrate. On the other hand, because no diffusion proceeds in the second piezoelectric layer formed on the far side from the substrate, the predetermined composition thereof is maintained. As a result, even when the piezoelectric layer of a certain large thickness is formed, the entire piezoelectric layer can be adjusted to the optimum composition and the good piezoelectric characteristic can be obtained.

BRIEF DESCRIPTION OF THE DRAWINGS

FIGS. 2A to 2E illustrate the process for manufacturing the piezoelectric actuator of the present embodiment.

BEST MODE FOR CARRYING OUT THE INVENTION

A specific embodiment of the present invention will be described below with reference to FIG. 1 to FIG. 3. The present embodiment illustrates an example in which the piezoelectric actuator in accordance with the present invention is employed in an ink-jet head 10 for an ink jet printer.

Figure 1:
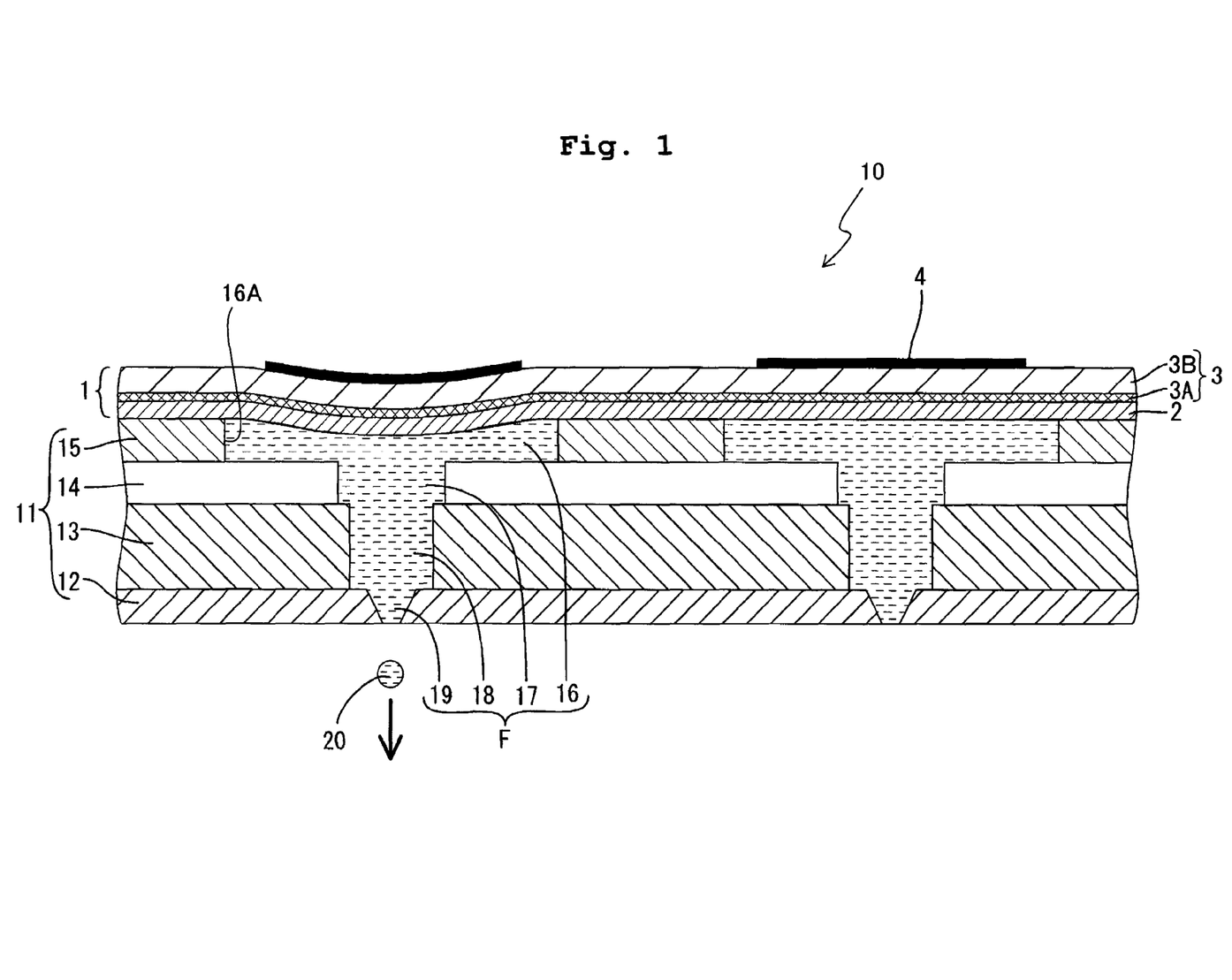
FIG. 1 is a side sectional view illustrating the ink-jet head of the present embodiment.

FIG. 1 shows an ink-jet head 10 of the present embodiment. The ink-jet head 10 includes a channel unit 11 (corresponds to the ink channel forming body of the present invention) having a plurality of pressure chambers 16 accommodating ink 20 and an actuator plate 1 (corresponds to the piezoelectric actuator in accordance with the present invention) joined above the channel unit 11 so as to close the pressure chambers 16.

The channel unit 11 as a whole has a plate-like shape and has a structure in which a manifold plate 13, a channel plate 14, and a pressure chamber plate 15 are laminated in this order on a nozzle plate 12. The plates 12, 13, 14, and 15 are bonded to each other with an epoxy thermosetting adhesive.

The nozzle plate 12 is formed of a polyimide synthetic resin material. A plurality of ink discharge nozzles 19 for ejecting the ink 20 are formed in a row in the nozzle plate 12, as shown in FIG. 1. The manifold plate 13 is formed, for example, of a stainless steel (SUS430), and a plurality of nozzle channels 18 that communicated with the ink discharge nozzles 19 are provided in the manifold plate 13. The channel plate 14 is formed of a stainless steel (SUS430), similarly to the manifold plate 13. A plurality of pressure channels 17 that communicates with the nozzle channels 18 are provided in the channel plate 14. The pressure chamber plate 15 is also formed of a stainless steel (SUS430). A plurality of pressure chambers 16 that communicates with the pressure channels 17 are provided in the pressure chamber plate 15. Each of the pressure chambers 16 is connected to the ink tank via a manifold channel and a common ink chamber (not shown in the figure) provided in the channel plate 14 and manifold plate 13. Thus, in the ink-jet head 10, a fluid passage F for the ink 20 is formed from the common ink chamber connected to the ink tank to the ink discharge nozzle 19 via the manifold channel, pressure chamber 16, pressure channel 17, and nozzle channel 18.

The actuator plate 1 laminated on the channel unit 11 includes a vibration plate 2 (corresponds to the substrate of the present invention) constructing a part of the wall surface (upper surface in FIG. 1) of the pressure chambers 16, a piezoelectric layer 3 formed on the vibration plate 2, and an upper electrode 4 provided on the piezoelectric layer 3.

The vibration plate 2 is formed, for example, of titanium and has a rectangular shape. The vibration plate 2 is joined by thermocompression to the upper surface of the channel unit 11 so as to cover the entire upper surface of the channel unit 11. The vibration plate 2 is connected to the ground of a drive circuit IC (not shown in the figure) and is used as a lower electrode.

The piezoelectric layer 3 is formed entirely on a surface of the vibration plate opposite to the surface of the vibration plate 2 which is in contact with the channel unit 11. The piezoelectric layer 3 is formed of a ferroelectric piezoelectric ceramic material such as lead zirconium titanate (PZT) and is laminated with a uniform thickness over the entire surface of the vibration plate 2. The piezoelectric layer is formed by the aerosol deposition method and subjected to polarization treatment so as to be polarized in the thickness direction thereof. The piezoelectric layer 3 has a two-layer structure (described hereinbelow in greater detail) comprising a first piezoelectric layer 3A formed on the vibration plate 2 and a second piezoelectric layer 3B formed on the first piezoelectric layer 3A.

A plurality of upper electrodes 4 is provided on the surface of the piezoelectric layer 3 on the side opposite from the vibration plate 2. Each of the upper electrodes 4 is provided on a region of the piezoelectric layer 3 corresponding to the opening 16A of each of the pressure chambers 16, is connected to the drive circuit IC, and is used as a drive electrodes.

When printing is conducted, the predetermined drive signals are generated from the drive circuit IC. As a result, the potential of the upper electrodes 4 becomes higher than that of the vibration plate 2 (lower electrode), and thus an electric field is applied in the polarization direction (thickness direction) of the piezoelectric layer 3. Under the effect thereof, the piezoelectric layer 3 expands in the thickness direction and shrinks (contracts) in the plane direction. As a result, the region of the piezoelectric layer 3 and vibration plate 2 (that is, the actuator plate 1) which correspond to the opening of the pressure chamber 16 is locally deformed (unimorph deformation) so as to form a protrusion on the side of the pressure chamber 16 (so as to protrude toward the pressure chamber 16). Therefore, the volume of the pressure chamber 16 decreases, pressure inside the pressure chamber 16 increases, and the ink 20 is ejected from the ink discharge nozzle 19. When the upper electrode 4 then returns to the potential equal to that of the vibration plate 2 (lower electrode), the piezoelectric layer 3 and vibration plate 2 restore the original shape and the volume of the pressure chamber 16 returns to the original volume. Therefore, at this time, the ink 20 is sucked in from the ink tank to the pressure chamber 16 via the manifold channel.

A method for the manufacture of the ink-jet head 10 including the actuator plate 1 will be described below with reference to FIGS. 2A to 2E.

First, holes which will serve as the nozzle channels 18, pressure channels 17, and pressure chambers 16 are formed by etching respectively in the manifold plate 13, channel plate 14, and pressure chamber plate 15 formed of the stainless steel. Then, the plates are laminated and joined to form a larger section of the channel unit 11 (the step of forming the ink channel forming body). Because the nozzle plate 12 is formed of the synthetic resin material, it melts when heated in the below-described annealing treatment. Therefore, the nozzle plate 12 is not joined in this step, but joined after the annealing treatment. However, similarly to other plates 13 to 15, the nozzle plate 12 may be also formed of the stainless steel. In this case, the holes which will serve as the ink discharge nozzles 19 may be formed by press forming in the nozzle plate 12 in the step of forming the ink channel forming body and this nozzle plate 12 may be joined after lamination together with other plates 13 to 15 to form the entire channel unit 11.

Figure 2A:
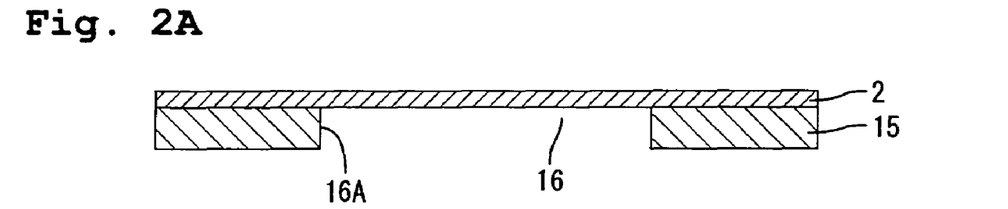
FIG. 2A shows how the vibration plate is joined to the pressure chamber plate.
Figure 3:
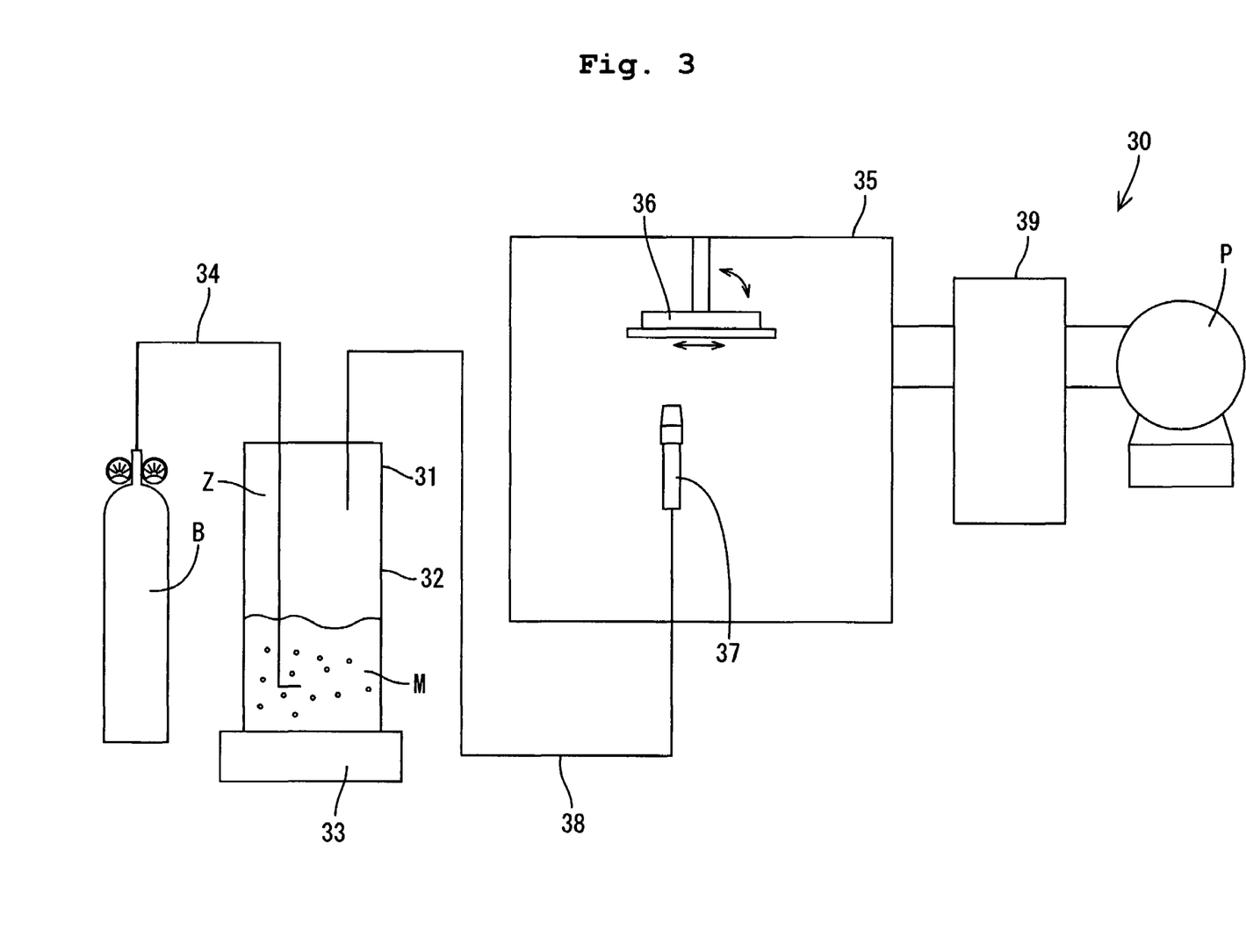
FIG. 3 is a schematic drawing of a film forming device.

Then, as shown in FIG. 2A, the vibration plate 2 formed of the stainless steel is aligned and placed on the upper surface of the pressure chamber plate 15 in the channel unit 11 and joined by thermocompression to seal the openings 16A of pressure chambers 16 with the vibration plate 2 (the step of joining the vibration plate).

Figure 2B:
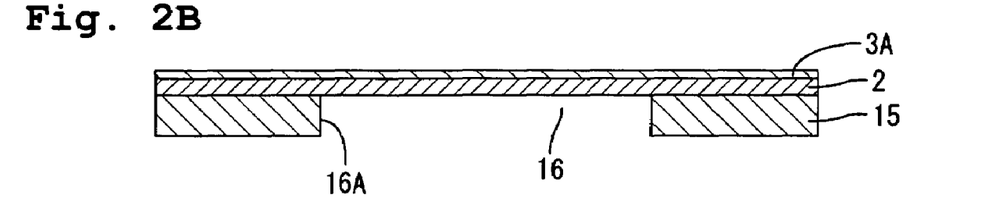
FIG. 2B shows how the first piezoelectric layer is formed.
Figure 2C:
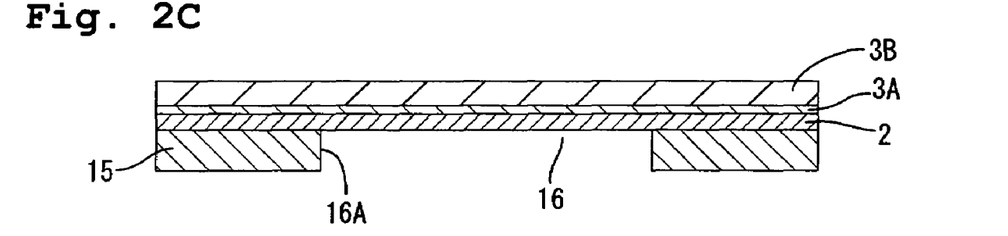
FIG. 2C shows how the second piezoelectric layer is formed.
Figure 2D:
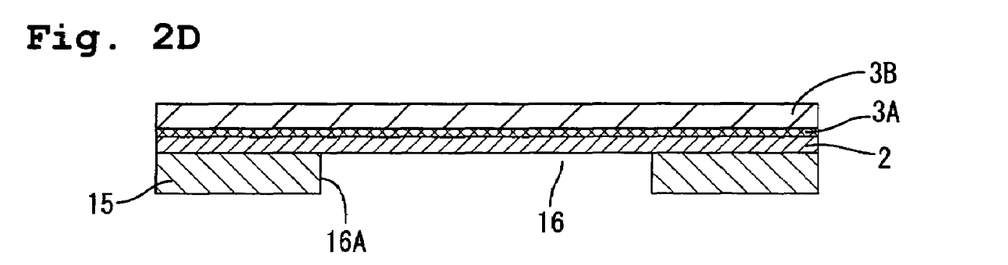
FIG. 2D shows how an element diffuses into the first piezoelectric layer by the annealing treatment.

Then, as shown in FIG. 2B and FIG. 2C, the first piezoelectric layer 3A and second piezoelectric layer 3B are successively formed in this order on the vibration plate 2 by the aerosol deposition method (AD method) (the step of forming the piezoelectric layer). FIG. 3 schematically shows a film forming device 30 for forming the piezoelectric layer 3. This film forming device 30 includes an aerosol generator 31 for forming aerosol Z by dispersing material particles M in a carrier gas, and a film forming chamber 35 for ejecting the aerosol Z from the ejection nozzle 37 to deposit the material particles M on the substrate.

The aerosol generator 31 has an aerosol chamber 32 capable of accommodating the material particles M inside thereof and an oscillation unit 33 attached to the aerosol chamber 32 for causing oscillations of the aerosol chamber 32. A gas cylinder B for introducing the carrier gas is connected to the aerosol chamber 32 via an introduction pipe 34. An end of the introduction pipe 34 is positioned close to the bottom surface inside the aerosol chamber 32 and disposed so as to be buried in the material particles M. An inactive gas such as helium, argon and nitrogen, air, and oxygen can be used as the carrier gas.

The film forming chamber 35 has a stage 36 for mounting the substrate in which the piezoelectric layer will be formed and the ejection nozzle 37 provided below the stage 36. The ejection nozzle 37 is connected to the aerosol chamber 32 via an aerosol supply pipe 38 so as to supply the aerosol Z inside the aerosol chamber 32 to the ejection nozzle 37 via the aerosol supply pipe 38. Furthermore, a vacuum pump P is connected via a powder recovery unit 39 to the film forming chamber 35, so as to decrease pressure of the inside thereof.

First, the first piezoelectric layer 3A is formed on the vibration plate 2 by using the film forming device 30 of the above-described structure, as shown in FIG. 2B (the step of forming the first piezoelectric layer 3A). More specifically, the vibration plate 2 is set in the stage 36. Then, the material particles M are charged into the aerosol chamber 32. For example, lead zirconium titanate (PZT) is used as the material particles M. In the composition of the PZT particles used for forming the first piezoelectric layer 3A of the present example, the composition ratio of Ti (corresponds to the diffusion element in accordance with the present invention) is slightly reduced by comparison with the optimum composition (predetermined composition) at which the most satisfactory piezoelectric characteristic can be obtained. The thickness of the first piezoelectric layer 3A is almost equal to the diffusion distance of Ti which diffuses from the vibration plate 2 to the first piezoelectric layer 3A by the below-described annealing treatment. More specifically, this thickness is 0.2 to 1 μm.

A carrier gas is then introduced from the gas cylinder B into the aerosol chamber 32 and the material particles M are raised upward by the gas pressure. At the same time, the aerosol chamber 32 is oscillated with the oscillation unit 33, thereby mixing the material particles M with the carrier gas and generating aerosol Z. The pressure inside the film forming chamber 35 is then reduced with the vacuum pump P to generate the difference in pressure between the aerosol chamber 32 and film forming chamber 35, and the aerosol Z in the aerosol chamber 32 is ejected from the ejection nozzle 37, while being accelerated to a high speed, by this difference in pressure. The material particles M contained in the ejected aerosol Z collide with the vibration plate 2 to be deposited on the vibration plate 2. Thus, the first piezoelectric layer 3A is formed on the vibration plate 2.

Then, as shown in FIG. 2C, the second piezoelectric layer 3B is formed on the first piezoelectric layer 3A (the step of forming the second piezoelectric layer). The material particles M used in the step of forming the second piezoelectric layer are PZT particles with an optimum composition demonstrating the most satisfactory piezoelectric characteristic. By using this material particles M, the second piezoelectric layer 3B is formed with the film forming device 30 in the same manner as in the step of forming the first piezoelectric layer.

After the film formation has been completed, the formed piezoelectric layer 3 is subjected to annealing treatment (the step of annealing) to obtain the necessary piezoelectric characteristic. In this step the Ti element (corresponds to diffusion element of the present application) constituting the vibration plate 2 diffuses to the first piezoelectric layer 3A by heating (state shown in FIG. 2D). Here, because the first piezoelectric layer 3A was formed to have a Ti composition ratio slightly less than that of the optimum composition (predetermined composition), the deficiency of Ti with respect to the optimum composition in the first piezoelectric layer 3A is replenished (supplemented) by diffusion of Ti from the vibration plate 2 to the first piezoelectric layer 3A and the composition of the first piezoelectric layer 3A becomes the optimum composition. In this process, the diffusion element (Ti) supplied from the vibration plate 2 diffuses only into the first piezoelectric layer 3A and does not reach the second piezoelectric layer 3B. Therefore, the diffusion of Ti produces no effect on the second piezoelectric layer 3B and the optimum composition thereof in film formation is maintained. Thus, the annealing treatment makes it possible to obtain the optimum composition in the entire piezoelectric layer 3.

Figure 2E:
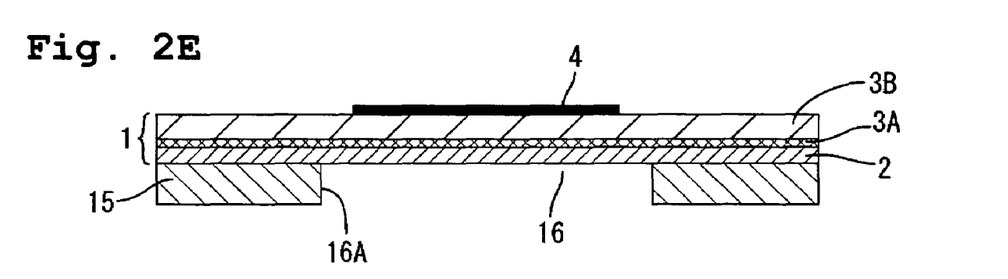
FIG. 2E shows how the upper electrodes are formed.

Then, as shown in FIG. 2E, the upper electrodes 4 and a plurality of lead sections (not shown in the figure) connected to each of the upper electrodes 4 are formed on the upper surface of the piezoelectric layer 3. In order to form the upper electrodes 4 and lead sections, for example, a conductive film may be formed on the entire area of the piezoelectric layer 3 and then the predetermined pattern may be formed by using a photolithography—etching method. Alternatively, a pattern may be directly formed on the upper surface of the piezoelectric layer 3 by a screen printing method. In this process, as shown in FIG. 2E, the upper electrodes 4 are formed in the regions of the piezoelectric layer 3 which correspond to the openings of the pressure chamber plate 15.

An electric field with an intensity higher than that during the usual ink ejection operation is then applied between the upper electrodes 4 and vibration plate 2 (lower electrode) to polarize the piezoelectric layer 3 in the thickness direction (polarization treatment). Finally, the nozzle plate 12 is joined to the manifold plate 13. The ink-jet head 10 is produced by the above-mentioned process.

As described above, in the present embodiment, particles with a composition in which the composition ratio of titanium was reduced from that of the optimum composition (predetermined composition) based on the diffusion amount of Ti element diffusing from the vibration plate 2 into the piezoelectric layer 3 were used as the material particles M in the step of forming the piezoelectric layer. Thus, in the step of forming the piezoelectric layer 3 in accordance with the present invention, the piezoelectric layer 3 is formed to have a composition different from the optimum composition by the diffusion amount of Ti. As a result, in the subsequent step of annealing treatment, the composition of the piezoelectric layer 3 is corrected by the diffusion of Ti from the vibration plate 2 into the piezoelectric layer 3 and the optimum composition is obtained.

In this process, the traveling distance (diffusion distance) of the diffusion element (Ti) which diffuses from the vibration plate 2 is about 0.2 μm to 1 μm from the interface between the vibration plate 2 and piezoelectric layer 3. Accordingly, the piezoelectric layer 3 is made to have a two-layer structure comprising a first piezoelectric layer 3A formed with a thickness of about 0.2 μm to 1 μm on the vibration plate 2 and the second piezoelectric layer 3B laminated on the first piezoelectric layer 3A, only the first piezoelectric layer 3A, which is in contact with the vibration plate 2, is formed to have a composition different from the optimum composition, and the second piezoelectric layer 3B laminated on the first piezoelectric layer is made to have the optimum composition. In this case, when the piezoelectric layer 3 is annealed, the composition of the first piezoelectric layer 3A is corrected by the diffusion of elements from the vibration plate 2 to obtain the optimum composition. On the other hand, because the diffusion does not advances to the second piezoelectric layer 3B, which is on the farther side from the vibration plate 2, the optimum composition of the second piezoelectric layer 3B is maintained. As a result, even when the piezoelectric layer 3 of a certain large thickness is formed, the optimum composition can be obtained in the entire piezoelectric layer 3 and the satisfactory piezoelectric characteristic can be obtained.

The present invention will be explained below in greater detail with reference to example thereof.

EXAMPLE

1. Formation of Piezoelectric Layer

1) Film Formation

A titanium plate was used as the substrate (vibration plate), and PZT with a mean particle size of about 0.7 μm (0.3 to 1 μm) was used as the material particles. PZT prepared to have the optimum composition (Zr: Ti=53:47) providing for the best piezoelectric characteristic in the vicinity of the morphotropic phase boundary and PZT prepared to be about 1% rich in Zr over the optimum composition were used. A film forming device used in this example identical to that of the above-described embodiment was used as the film forming device.

The first piezoelectric layer was formed by blowing aerosol containing Zr-rich PZT powder on the substrate surface. The film was formed under the following conditions: nozzle opening 0.4 mm×10 mm, pressure inside film forming chamber 200 Pa, pressure inside the aerosol chamber 30,000 Pa, He carrier gas, gas flow rate 3.0 L/min, and spacing between the nozzle and substrate 10 to 20 mm. The thickness of the first piezoelectric layer was about 1 μm. The thickness of the first piezoelectric layer was measured by differential (difference in thickness) measurements with a surface roughness meter.

Then, a second piezoelectric layer was formed on the first piezoelectric layer by blowing aerosol comprising PZT particles with the optimum composition. The film forming conditions were identical to those employed in the formation of the first piezoelectric layer. The entire thickness of the piezoelectric layer was about 8.5 μm. The thickness of the piezoelectric layer was measured by differential measurements with a surface roughness meter.

2) Annealing Treatment

Then, the formed piezoelectric layer was subjected to the annealing treatment. More specifically, the temperature of a muffler furnace (FP100, manufactured by Yamato Kogyo Co.) was raised to 700° C., and then the substrate with the piezoelectric layer formed thereon was placed into the furnace. The substrate was held for 10 min (minutes) inside the furnace, then removed from the furnace and cooled to room temperature by natural cooling.

2. Test

Masking was conducted on the piezoelectric layer by using an adhesive resin tape, upper electrodes with an effective surface area of 3.6 mm² or more were formed by using an Au deposition apparatus, and the substrate was used as a lower electrode. In this manner, a piezoelectric actuator was composed. Then, a polarization treatment was conducted under an applied electric field of 300 kV/cm. Electrostatic capacity of the piezoelectric actuator manufactured by the above-described method was measured, while applying a voltage, by using a ferroelectric meter (TFANALYZER 2000; manufactured by AiXACT Co.), and the residual polarization (Pr) and coercive electric field (Ec) were measured.

Comparative Example

In a comparative example, the piezoelectric layer was formed of only one layer by using a PZT powder having the optimum composition and forming the film under conditions identical to those of the example. The thickness of the piezoelectric layer was about 8 μm. The thickness of the piezoelectric layer was measured by differential measurements with a surface roughness meter. The piezoelectric actuator was fabricated in the same manner as in the embodiment except that the piezoelectric layer was composed of only one layer. The piezoelectric actuator manufactured in the comparative example was also subjected to the test identical to that of the example.

[Results and Discussion]

The results of the tests conducted in the example and comparative example are shown in Table 1.

TABLE 1

|  | Comparative Example | Example |
|---|---|---|
| Annealing temperature, ° C. | 700 | 700 |
| Annealing time, min | 10 | 10 |
| Piezoelectric layer thickness, μm | 8 | 8.5 |
| Electric field applied, kV/cm | 300 | 300 |
| Pr, μm/cm$^2$ | 33 | 35 |
| Ec, kV/cm | 75 | 62 |
| Pr/Ec | 0.44 | 0.56 |

As shown in Table 1, in the piezoelectric actuator of the comparative example, the Pr/Ec ratio was 0.44 and was lower than that of the piezoelectric actuator of the example. This was because the composition of the piezoelectric layer of the comparative example was different from the optimum composition by the diffusion of Ti element contained in the substrate to the piezoelectric layer. By contrast, in the piezoelectric actuator of the example, the Pr/Ec ratio was 0.56 which is a satisfactory value. This was apparently because, during the annealing treatment, the Ti element contained in the substrate diffused into the Zr-rich first piezoelectric layer which was previously formed in the vicinity of the interface between the piezoelectric layer and the substrate and the composition of the first piezoelectric layer after the annealing treatment could be adjusted close to the optimum composition.

The technological scope of the present invention is not limited to the above-described embodiment. For example, the following configurations are also included into the technological scope of the present invention. Furthermore, the technological scope of the present invention also encompasses the range of equivalents: (1) In the above-described embodiment, the vibration plate 2 was formed of Ti and the diffusion element which diffused into the first piezoelectric layer 3A was Ti, but the substrate (vibration plate) may be also formed of a material containing no Ti and an interlayer containing Ti may be formed on the surface of the substrate. (2) In the above-described embodiment, the piezoelectric layer had a two-layer structure, but, for example, in the case of a very thin piezoelectric layer, the piezoelectric layer may have a monolayer structure formed of a material particles having a composition different from the optimum composition. (3) In the above-described embodiment, the material particles were used in which the composition ratio of the element to be diffused from the substrate into the piezoelectric layer by the annealing treatment was previously decreased. However, as in the case where the substrate is formed of silicon and the piezoelectric material is PZT, for example, an element (in this case Pb) diffuses into the substrate from the piezoelectric layer by the annealing treatment, the piezoelectric layer may be formed by using material particles containing the diffusion element in excess.

The invention claimed is:

1. A method for manufacturing a piezoelectric actuator provided with a substrate and a piezoelectric layer having a predetermined composition and formed on the substrate, the method comprising the steps of:

forming the piezoelectric layer by blowing an aerosol containing particles of a piezoelectric material on a surface of the substrate to adhere the particles to the substrate; and annealing the piezoelectric layer, wherein a diffusion element which diffuses between the substrate and the piezoelectric layer in the step of annealing is contained in each of the particles, and the composition ratio of the diffusion element in each of the particles is different from the composition ratio of the diffusion element in the predetermined composition.

2. The method for manufacturing the piezoelectric actuator according to claim 1, wherein the composition ratio of the diffusion element in each of the particles is less than the composition ratio of the diffusion element in the predetermined composition.

3. The method for manufacturing the piezoelectric actuator according to claim 1, wherein the step of forming the piezoelectric layer includes the steps of:

forming a first piezoelectric layer by blowing an aerosol containing particles of a first piezoelectric material on the surface of the substrate, the first piezoelectric material having the diffusion element with the composition ratio different from the composition ratio of the diffusion element in the predetermined composition; and forming a second piezoelectric layer by blowing an aerosol containing particles of a second piezoelectric material of the predetermined composition on the first piezoelectric layer.

4. The method for manufacturing the piezoelectric actuator according to claim 3, wherein the composition ratio of the diffusion element in each of the particles of the first piezoelectric material is less than the composition ratio of the diffusion element in the predetermined composition.

5. The method for manufacturing the piezoelectric actuator according to claim 3, wherein: the thickness of the first piezoelectric layer is not less than 0.2 μm to not more 1 μtm; and, in the step of the annealing, a heating temperature is not less than 600° C. to not more than 800° C., and a heating time is not less than 30 min to not more than 180 min.

6. The method for manufacturing the piezoelectric actuator according to claim 1, wherein the substrate is a metallic substrate.

7. The method for manufacturing the piezoelectric actuator according to claim 6, wherein the substrate contains at least one element selected from the group consisting of Cr, Fe, Ti, and Si.

8. The method for manufacturing the piezoelectric actuator according to claim 1, wherein the piezoelectric material is PZT.

9. A method for manufacturing an ink-jet head, the ink-jet head including an ink channel forming body having a plurality of pressure chambers each of which is provided with an opening in one surface side of the ink channel forming body and that communicates with an ink discharge nozzle which discharges ink, and a piezoelectric actuator having a vibration plate provided in the one surface side of the ink channel forming body to close the opening and a piezoelectric layer formed on the vibration plate, the method comprising the steps of:

forming the piezoelectric layer by blowing an aerosol containing particles of a piezoelectric material on the surface of the substrate to adhere the particles to the substrate; and annealing the piezoelectric layer, wherein a diffusion element which diffuses between the substrate and the piezoelectric layer in the step of annealing is contained in each of the particles, and the composition ratio of the diffusion element in each of the particles is different from a composition ratio of the diffusion element in a predetermined composition.

10. The method for manufacturing the ink-jet head according to claim 9, wherein the composition ratio of the diffusion element in each of the particles is less than the composition ratio of the diffusion element in the predetermined composition.

11. The method for manufacturing an ink-jet head according to claim 9, further comprising, prior to the step of forming the piezoelectric layer, the steps of:

forming the ink channel forming body, and joining the vibration plate to the ink jet forming body.

12. The method for manufacturing the ink-jet head according to claim 9, wherein the substrate is a metallic substrate.

13. The method for manufacturing the ink-jet head according to claim 12, wherein the substrate contains at least one element selected from a group consisting of Cr, Fe, Ti, and Si.

14. The method for manufacturing the ink-jet head according to claim 9, wherein the piezoelectric material is PZT.

* * * * *